(12) United States Patent
Yu et al.

(10) Patent No.: US 8,264,886 B2
(45) Date of Patent: *Sep. 11, 2012

(54) DELAYED ACTIVATION OF SELECTED WORDLINES IN MEMORY

(75) Inventors: Xiaojun Yu, Beacon, NY (US); Jin-man Han, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 297 days.

This patent is subject to a terminal disclaimer.

(21) Appl. No.: 12/688,600

(22) Filed: Jan. 15, 2010

(65) Prior Publication Data

US 2010/0118611 A1    May 13, 2010

Related U.S. Application Data

(63) Continuation of application No. 11/657,951, filed on Jan. 25, 2007, now Pat. No. 7,649,783.

(51) Int. Cl.
*G11C 16/06* (2006.01)
*G11C 16/32* (2006.01)
*G11C 16/26* (2006.01)
*G11C 16/08* (2006.01)

(52) U.S. Cl. ......... 365/185.23; 365/185.17; 365/185.18; 365/185.03; 365/194; 365/233.14; 365/233.17

(58) Field of Classification Search ............. 365/185.03, 365/185.17, 185.18, 185.21, 185.23, 194, 365/233.1, 233.14, 233.17
See application file for complete search history.

(56) References Cited

U.S. PATENT DOCUMENTS

| | | | |
|---|---|---|---|
| 6,028,792 A | 2/2000 | Tanaka et al. | |
| 7,035,144 B2 | 4/2006 | Kim et al. | |
| 7,068,543 B2 | 6/2006 | Mihnea et al. | |
| 7,366,040 B2 | 4/2008 | Chen | |
| 7,649,783 B2 | 1/2010 | Yu et al. | |
| 2003/0189856 A1 | 10/2003 | Cho et al. | |
| 2007/0097759 A1* | 5/2007 | Chen | 365/194 |
| 2007/0140016 A1* | 6/2007 | Kamei | 365/185.23 |
| 2008/0181032 A1 | 7/2008 | Yu et al. | |

* cited by examiner

*Primary Examiner* — J. H. Hur
(74) *Attorney, Agent, or Firm* — Schwegman, Lundberg & Woessner, P.A.

(57) ABSTRACT

Apparatus, systems, and methods may operate to receive an external read command at a control circuit coupled to a memory array. Individual wordline activation may be delayed according to a delay period determined by a read level voltage magnitude associated with a plurality of memory cells included in the array.

13 Claims, 4 Drawing Sheets

DELAYED ACTIVATION OF SELECTED WORDLINES IN MEMORY

RELATED APPLICATION

This application is a continuation of U.S. application Ser. No. 11/657,951, filed Jan. 25, 2007 now U.S. Pat. No. 7,649,783, which is incorporated herein its entirety by reference.

TECHNICAL FIELD

Various embodiments described herein relate to apparatus, systems, and methods associated with information storage and processing, including the operation and manufacture of memories having volatile and non-volatile storage.

BACKGROUND INFORMATION

Continuously reducing the size of solid-state memory architecture is an effective way to increase the capacity of such memories for a given amount of circuit real estate. However, the resulting feature size can give rise to design and process challenges. For example, the resistive-capacitive delay along wordlines in a memory array can dramatically increase with feature size reduction, providing strong electrical coupling between adjacent wordlines. The effects can most easily be seen as a reduction of the read threshold voltage (Vt) margin. As the wordlines in an array (both selected and unselected) are driven to desired values at about the same time, the far end of selected wordlines is often coupled to a voltage that is significantly higher than the near end.

The Vt margin may shrink for at least two reasons. First, the wordline coupling magnitude can be highly dependent on the target read level voltage, increasing with lower read voltage levels. For example, in some memories, a read voltage level of 0.1 V gives a coupling differential of 1.7 V, while a read voltage level of 2.7 V provides a coupling differential of only 0.5 V. Second, the offset from the target read voltage at the far end of a selected wordline can also strongly depend on the read voltage level.

As the use of multi-level cell (MLC) memory architecture becomes increasingly popular, preserving adequate Vt margins takes on added significance, because multiple read level voltages can be used within the same memory cell. Conventional approaches include waiting for all wordlines to settle so that read voltage levels can be accurately assessed. However, this solution results in increasingly long read times, so that MLC read operations can take longer than read operations for single cells. Program-verify operations are also affected. Thus, there is a need for apparatus, systems, and methods that provide a mechanism to reduce the read time, and increase read reliability of memory arrays having single-level cell (SLC) and MLC architectures.

DETAILED DESCRIPTION

To address the challenges described above, various embodiments described herein may operate to provide a revised control sequence for memory cell read operations. Instead of driving all wordlines to their ultimate voltages at the same time, the wordline coupled to a selected cell may be held at ground potential while the unselected wordlines are driven to normal levels. After a suitable delay that corresponds to the read voltage level in use, the selected wordline may then be activated, or driven to its target level. This sequence allows all wordlines to settle toward their ultimate voltages more quickly.

Figure 1A:
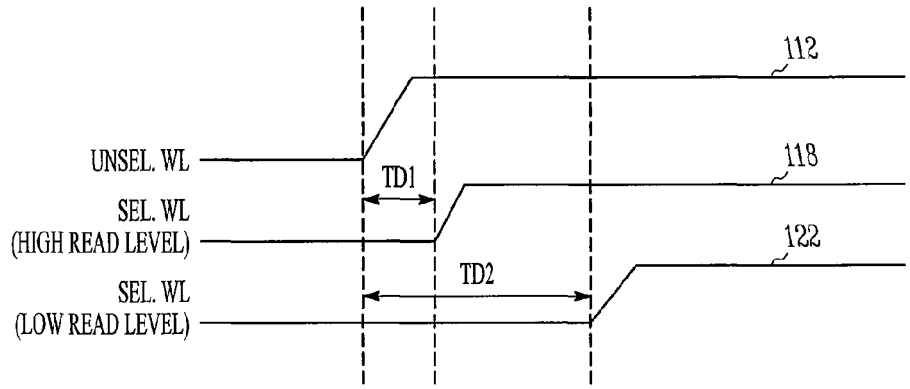
FIG. 1A is a signal diagram illustrating relative amplitudes of wordline voltages during read operations conducted according to various embodiments of the invention.

FIG. 1A is a signal diagram illustrating relative amplitudes of wordline 112, 118, 122 voltages during read operations conducted according to various embodiments of the invention. Here it can be seen that inventive embodiments include operating so as to delay the activation of some wordlines (e.g., selected high read level wordline 118 and/or selected low read level wordline 122) in relation to others (e.g., unselected wordlines 112) during read operations. The delay periods TD1 and TD2 may be selected according to the read level voltage in use. The effect of implementing delayed wordline activation may be more easily understood by referring to a few basic non-volatile memory operations.

Bitline strings within memory arrays may include a number of non-volatile memory cells, such as NAND flash memory cells. Each cell may include a substrate, a source, a control gate (coupled to an individually selectable wordline), a floating gate electrically isolated by an insulating layer of silicon dioxide $SiO_2$, and a drain. Electrical access to the floating gate takes place through a network of surrounding $SiO_2$ layers, as well as the source, drain, a channel, and the control gate. Charge present on the floating gate is retained due to the energy barrier height of the $SiO_2$, leading to the non-volatile nature of the memory cell.

Programming the memory cell means that charge (i.e., electrons) is added to the floating gate. A high drain to source bias voltage is applied, along with a high control gate voltage. The gate voltage inverts the channel, while the drain bias accelerates electrons towards the drain. In the process of crossing the channel, some electrons will experience a collision with the silicon lattice and become redirected towards the $SiO_2$ interface. With the aid of the field produced by the gate voltage, some of these electrons will travel across the oxide and become added to the floating gate. After programming is complete, the electrons added to the floating gate increase the cell's threshold voltage.

Reading a memory cell includes several activities. For cells that have been programmed, the turn-on voltage of cells is increased by the increased charge on the floating gate. By applying a control gate voltage via an individual wordline to select a particular cell for reading, and by monitoring the drain current, differences between cells with charge and cells without charge on their floating gates can be determined. A sense amplifier may be used to compare selected cell drain current with that of a reference cell (typically a flash cell which is programmed to the reference level during manufacturing test). An erased cell should have more cell current than the reference cell and therefore may be read as a logical "1,"

while a programmed cell should draw less current than the reference cell and may be read as a logical "0." Reading, like programming, is a cell-specific operation.

The embodiments described herein provide a new control sequence for wordlines during read operations. In various embodiments, instead of driving all wordlines (both selected and unselected) to their respective voltages at about the same time, the wordline (e.g., selected wordline 118 or 122) coupled to the selected cell is held at a selected initial potential (e.g., about zero volts, or ground) while the unselected wordlines 112 are driven to normal levels. After a suitable delay time period TD1 or TD2, which begins at about the same time as the unselected wordlines 112 are driven to their target levels, the selected wordline 118 or 122, respectively, is then activated, or driven to its target level. The duration of the delay time period TD1 or TD2 depends on the read voltage level in use. This mechanism, which operates to delay the activation of selected wordlines in accordance with the read voltage level in use, permits all wordlines, both selected and unselected, to settle to their target voltage values more quickly, reducing the read time for individual cells.

Figure 1B:
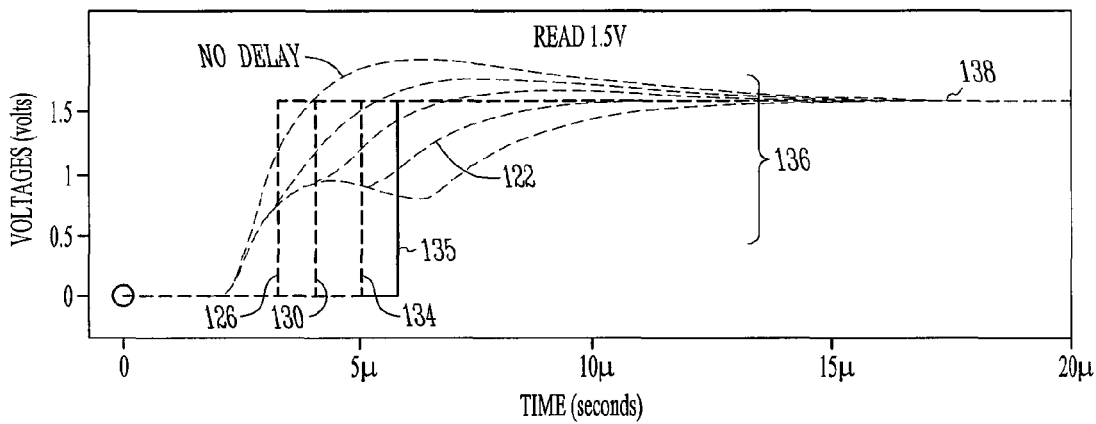
FIG. 1B is a graph illustrating selected wordline delay voltages during 1.5V read operations conducted according to various embodiments of the invention.

FIG. 1B is a graph illustrating selected wordline delay voltages during 1.5V target voltage read operations conducted according to various embodiments of the invention. Here it can be seen that adjusting the selected wordline activation according to a delay period 126 of 1 microseconds, a delay period 130 of 2 microseconds, a delay period 134 of 3 microseconds, or a delay period 135 of 4 microseconds, affects the far-end wordline settling time. In this case, the selected wordline 122 (which is the latter part of the delay period 130) settles most quickly when a delay period of about 3 microseconds is used since the far-end voltage magnitude 136 approaches the target voltage level 138 in a shorter period of time.

Figure 1C:
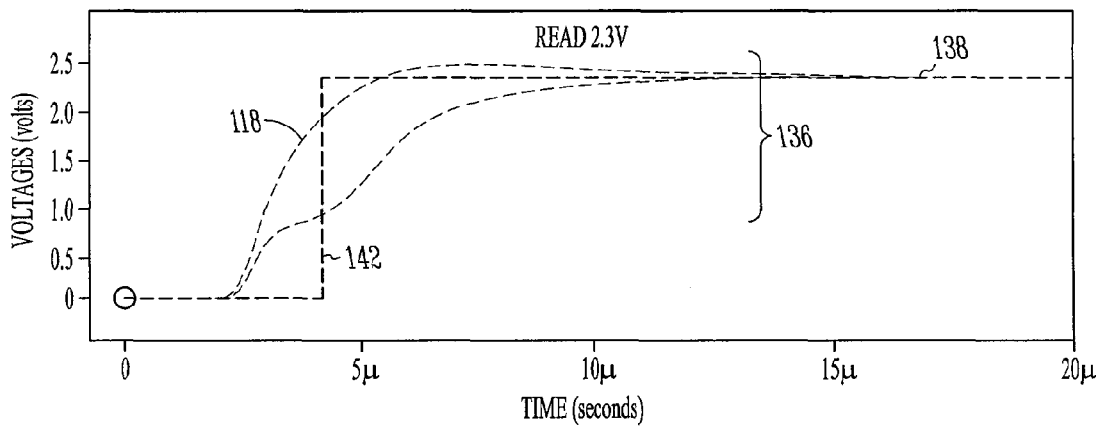
FIG. 1C is a graph illustrating selected wordline delay voltages during 2.3V read operations conducted according to various embodiments of the invention.

FIG. 1C is a graph illustrating selected wordline delay voltages during 2.3V read operations conducted according to various embodiments of the invention. In this case, a delay period 142 of only 2 microseconds prior to activation results in a reasonably fast settling time for the selected wordline 118. Thus, for lower read voltage levels (e.g., shown in FIG. 1B), longer activation delays for the selected wordline 122 may be in order, providing sufficient time for far-end recovery so that a selected Vt margin is preserved. Since the selected wordline 122 rises to the target voltage relatively quickly after the end of the delay period, postponing activation of the selected wordline does not increase the overall read time. For higher read voltages (e.g., shown in FIG. 1C), even though it may take longer for the selected wordline 118 to reach its target level, the adjacent wordline coupling magnitude (between the selected wordline 118 and unselected wordlines) is also lower, so shorter delays may be used. Thus, by delaying activation of selected wordlines according to read voltage levels, the overall read time for cells can be reduced. In addition, in the case of MLC memory structures, and when program-verify operations are immediately followed by read operations, read accuracy may be improved.

Figure 2:
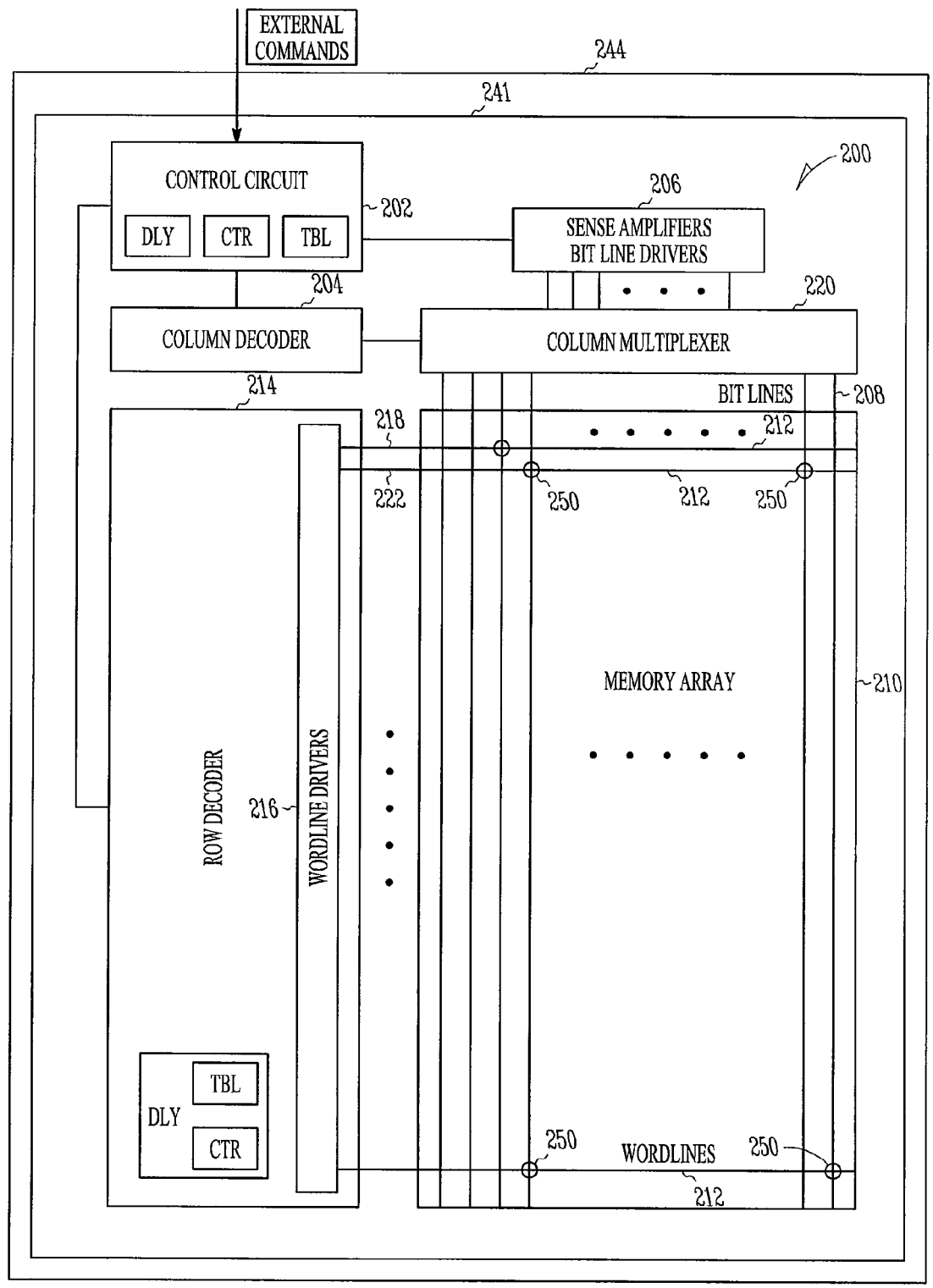
FIG. 2 is a block diagram of an apparatus according to various embodiments of the invention.

FIG. 2 is a block diagram of an apparatus 200 according to various embodiments of the invention. The apparatus 200 may comprise a flash memory which includes a control circuit 202 for controlling the operations of the memory such as reading, writing, and erasing. The apparatus 200 may also include a column decoder 204, sense amplifiers/bitline drivers 206, bitlines 208, wordlines 212, 218, 222, a row decoder 214 with wordline drivers 216 coupled to the wordlines 212, and a column multiplexer 220.

It should be understood that any of the wordlines 212, 218, 222 shown in FIG. 2 can be selected or not, as may be useful to read the content of cells 250. However, to simplify the following discussion, the wordline label 212 will generally be used herein to indicate an unselected wordline, while the wordline labels 218, 222 will be used to indicate a selected wordline for high level and low level read voltages, respectively. In various embodiments, different read voltage levels may be employed on the same wordline, or on different wordlines, as desired.

The apparatus 200 may further comprise a memory array 210, such as an erasable memory array, formed on or attached to a substrate 241. The array 210 may comprise, in turn, a plurality of memory cells 250, similar to or identical to the memory cells described above. Thus, the apparatus 200 may also comprise a plurality of memory cells 250 (included in the array 210) coupled to a wordline 218 or 222 selected in response to receiving an external read command.

Some embodiments of the apparatus 200 may include a semiconductor memory comprising a semiconductor memory package 244, such as a thin small outline package (TSOP), a multi-chip package (MCP), or a package-on-package (PoP), that can be used to house the substrate 241. That is, the substrate 241 and memory array 210 may be disposed within the semiconductor memory package 244. Such packages are known to those of ordinary skill in the art, and can be obtained from Micron Technology, Inc.

The unselected wordlines 212 may be similar to or identical to unselected wordline 112 shown in FIG. 1A. The selected wordlines 218, 222 may be similar to or identical to the selected wordlines 118, 122 shown in FIGS. 1A, 1B, and 1C. The memory array 210 may comprise a flash memory array, and the memory cells 250 may comprise NAND flash memory cells, so that the memory array 210 comprises a NAND flash memory array.

In some embodiments, the apparatus 200 comprises a delay circuit DLY to delay selection of a selected wordline 218 and/or 222 for a delay period determined according to a function of the target read level voltage magnitude. After the delay period is ended, so that the unselected wordlines 212 have settled to the degree desired, the selected wordline 218 and/or 222 can then be activated, or driven to its target read voltage value. The delay circuit DLY may be included in the control circuit 202, the row decoder 214, or in any other element of the apparatus 200.

Some embodiments, such as those with memory cells 250 comprising a portion of an SLC structure, may use only one read level voltage, along with a single delay period. If the memory cells 250 form part of an MLC architecture, multiple delay periods (e.g., three) may be used, perhaps forming a one-to-one correspondence with the various read voltages employed. It should be noted that more than three delay periods may be used, if desired, and the various embodiments are not to be so limited.

In some embodiments, a set of lower-level read voltages (e.g., read voltages less than about 1 V) might have associated wordline 222 activation delays, while wordline 218 activation associated with higher-level read voltages (e.g., read voltages greater than about 2V) might not be delayed at all. As a matter of contrast, in some cases, the activation of every selected wordline 218 and/or 222 used in a read operation may be delayed for some period while the unselected wordlines 212 are permitted to settle. The delay period may be between about 1 microsecond and ten microseconds.

In some embodiments, the delay circuit DLY may comprise a counter CTR to count the desired delay period. For example, if the control circuit 202 has control circuitry to indicate one of three read level voltages, then the counter CTR may be permitted to count up to one of three indicated values (corresponding to the read voltage in use) after a read operation begins. At the time counting is finished, an indication that the delay period is ended may be communicated to the control circuit 202, and the selected wordline 218 or 222 may then be driven from ground (or some other initial voltage) to the target wordline voltage.

Thus, the control circuit 202 may be coupled to a plurality of memory cells 250 and used to receive an external read command, and the delay circuit DLY may be included in the control circuit 202. The delay circuit DLY may operate to determine the delay period in accordance with a discrete number of values associated with the read level voltage magnitude. In some cases, the length of the delay period may be determined by the delay circuit DLY to be inversely proportional to the read level voltage magnitude (e.g., lower read level voltages may be associated with longer delay periods). The delay period may also be determined according to one or more values included in a table TBL having entries referenced according to the read level voltage magnitude. Thus, the table TBL may include values associated with the delay period, and the table TBL of values may be stored in the control circuit 202, or the row decoder 214, or both. The wordline drivers 216 may be used to ground the selected wordline 218 or 222 until the end of the delay period.

Figure 3:
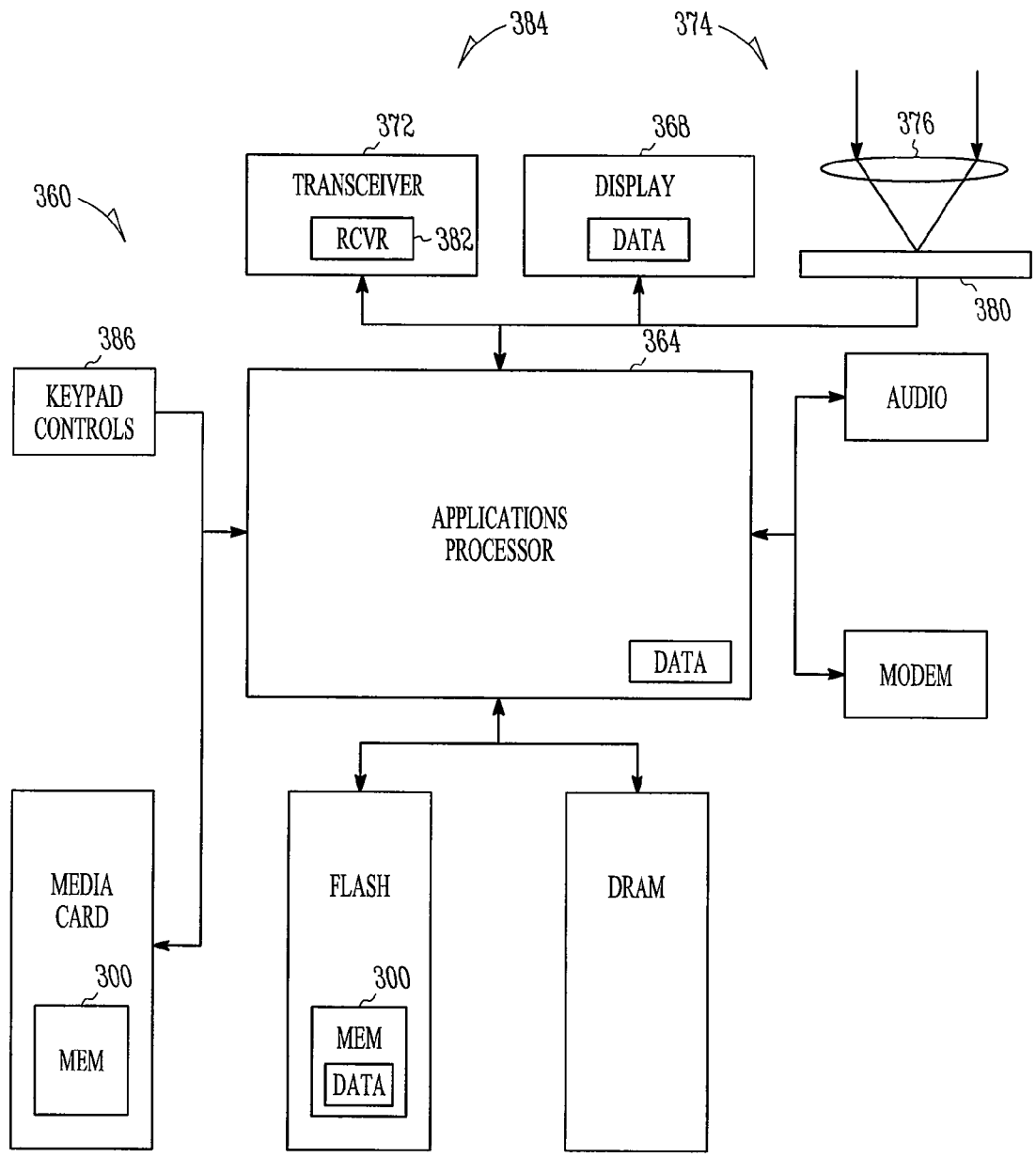
FIG. 3 is a block diagram of a system according to various embodiments of the invention.

FIG. 3 is a block diagram of a system 360 according to various embodiments of the invention. The system 360 may include one or more apparatus 300, which may be similar to or identical to the apparatus 200 shown in FIG. 2.

The system 360, in some embodiments, may comprise a processor 364 coupled to a display 368 and/or a wireless transceiver 372. The memory array(s) included in the apparatus 300 and comprising a plurality of memory cells may also be operatively coupled to the processor 364 via one or more wordlines. Thus, the processor 364 may issue external commands, such as external read commands, to be received and processed by control circuitry in the apparatus 300. Memory cells storing data in the apparatus 300 may be selected in response to the external commands. The display 368 may be used to display data, which may be received by the wireless transceiver 372, and stored in the erasable memory array(s) of the apparatus 300.

In some embodiments, the system 360 may comprise a camera 374, including a lens 376 and an imaging plane 380 coupled to the processor 364. The imaging plane 380 may be used to receive light captured by the lens 376.

Many variations are possible. For example, in some embodiments, the system 360 may comprise a cellular telephone receiver 382 forming a portion of the wireless transceiver 372. The cellular telephone receiver 382 may also receive data to be processed by the processor 364, and displayed on the display 368. In some embodiments, the system 360 may comprise an audio, video, or multi-media player 384, including a set of media playback controls 386 coupled to the processor 364.

Any of the components previously described may be implemented in a number of ways, including embodiments in software. Software embodiments may be used in a simulation system, and the output of such a system may be used to operate various portions of the apparatus 200, 300, and the systems 360 described herein.

Thus, the wordlines 112, 118, 122, 212, 218, 222; delay periods 126, 130, 134, 142, TD1, TD2; target voltage level 138; apparatus 200; control circuit 202; column decoder 204; sense amplifiers/bitline drivers 206; bitlines 208; row decoder 214; wordline drivers 216; column multiplexer 220; substrate 241; memory cells 250; system 360; processor 364; display 368; wireless transceiver 372; camera 374; lens 376; imaging plane 380; player 384; media playback controls 386; counter CTR; delay circuit DLY; and table TBL may all be characterized as "modules" herein.

The modules may include hardware circuitry, optical components, single or multi-processor circuits, memory circuits, software program modules and objects, firmware, and combinations thereof, as desired by the architect of the apparatus 200, 300 and the systems 360, and as appropriate for particular implementations of various embodiments.

The apparatus and systems of various embodiments may be useful in applications other than reading a NAND flash memory array, and thus, the various embodiments are not to be so limited. The illustrations of the apparatus 200, 300 and the systems 360 are intended to provide a general understanding of the structure of various embodiments, and not as a complete description of all the elements and features of apparatus and systems that might make use of the structures described herein.

The novel apparatus and systems of various embodiments may comprise and/or be included in electronic circuitry used in high-speed computers, communication and signal processing circuitry, single or multi-processor modules, single or multiple embedded processors, multi-core processors, data switches, and application-specific modules including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others. Some embodiments may include a number of methods.

Figure 4:
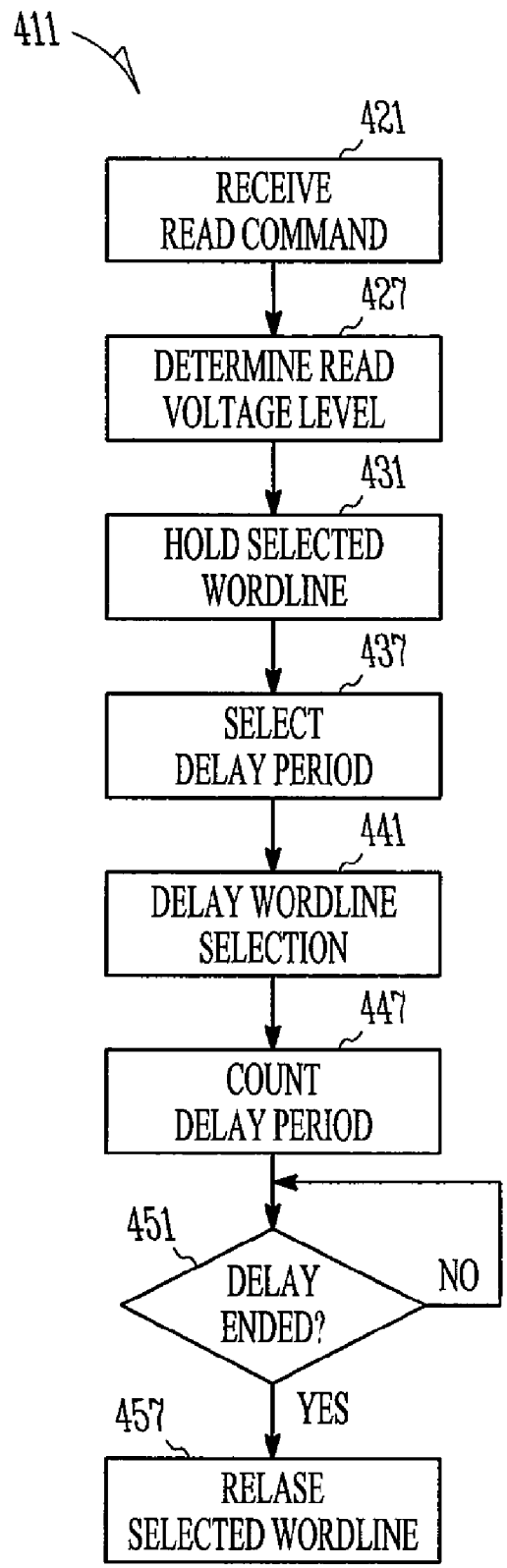
FIG. 4 is a flow diagram illustrating several methods according to various embodiments of the invention.

FIG. 4 is a flow diagram illustrating several methods 411 according to various embodiments of the invention. A method 411 may commence at block 421 with receiving an external read command, perhaps from a processor, at a control circuit coupled to a memory array. The method 411 may continue with determining the read level voltage magnitude at block 427, perhaps from among a number of discrete levels, such as from a group of at least three discrete levels. Any number of levels may be used, including a single level. The method 411 may go on to include, responsive to receiving the external read command, holding the selected wordline at a grounded state at block 431.

In some embodiments, the method 411 may include selecting the delay period for the selected wordline at block 437. The delay period may be selected in a number of ways. For example, the delay period may be selected according to the coupling window length associated with the target read level voltage and an unselected wordline voltage. The coupling window length may also be determined according to the degree of settling desired for unselected wordlines. Referring back to FIG. 1B, for example, potential coupling window lengths may approximate the same length of time as the delay periods 126, 130, and 134.

Delay periods may also be selected according to one or more values included in a table that has entries referenced according to the read level voltage magnitude. Such values may be used in comparison with a delay counter value (e.g., counter CTR of FIG. 2), for example. In some embodiments, for a read voltage magnitude comprising a first level greater than a second level, the delay period may be selected to comprise a first delay period shorter than a second delay period that is selected in association with the second level.

That is, shorter delay periods may be selected in association with higher read voltage levels, and vice-versa.

The method 411 may go on to include delaying activation of the wordline coupled to a plurality of memory cells included in the memory array according to the delay period at block 441 (as determined by the read level voltage magnitude associated with the memory cells). The method 411 may continue at block 447 with counting out the delay period according to a predetermined counter value. That is, activation of the wordline may be delayed while the delay period is counted out.

If the delay period is not yet ended (e.g., counting is not complete), as determined at block 451, the method 411 may include continuing to wait until the delay is ended. Otherwise, if the delay is ended (e.g., if counting is determined to be complete) at block 451, then the method 411 may continue at block 457 with releasing the selected wordline from the grounded state at the end of the delay period, enabling driving the selected wordline to reach approximately the target read voltage magnitude, so that the selected wordline is activated.

It should be noted that the activities described herein may be executed in an order other than the order described. The various activities described with respect to the methods identified herein may also be executed in repetitive, serial, and/or parallel fashion.

A software program may be launched from a computer-readable medium in a computer-based system to execute functions defined in the software program. Various programming languages may be employed to create software programs designed to implement and perform the methods disclosed herein. The programs may be structured in an object-oriented format using an object-oriented language such as Java or C++. Alternatively, the programs may be structured in a procedure-oriented format using a procedural language, such as assembly or C. The software components may communicate using a number of mechanisms well known to those of ordinary skill in the art, such as application program interfaces or inter-process communication techniques, including remote procedure calls. The teachings of various embodiments are not limited to any particular programming language or environment. Thus, other embodiments may be realized.

For example, an article of manufacture, such as a computer, a memory system, a magnetic or optical disk, some other storage device, and/or any type of electronic device or system may include a processor coupled to a machine-accessible medium such as a memory (including the memory array 210 of FIG. 2) having associated information (e.g., computer program instructions and/or data), which, when accessed, results in a machine (e.g., the processor) performing any of the activities described herein with respect to the methods shown in FIG. 4.

The apparatus, systems, and methods disclosed herein may operate to reduce the far-end coupling effects between wordlines in a memory array. Delaying the activation of a selected wordline, while unselected wordlines are permitted to settle for the preselected delay period, may increase the operational reliability of NAND flash memory arrays during read operations. Even greater improvement may be expected when MLC architecture is used.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims and the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

Voltage magnitudes for "low" logic signals and "high" logic signals are normally not defined since they can have a variety of relative values, including negative voltages and positive voltages. "High" and "low" logic signals are defined only by their relationship to one another in representing binary values. For example, a "high" logic signal may have a voltage level or potential higher than a "low" logic signal, or the "low" signal may have a different polarity or negative polarity with respect to the "high" signal. As those of ordinary skill in the art well understand, in some logic systems, a "high" logic value may even be represented by a ground potential when the relative "low" logic value is represented by a negative voltage potential in reference to ground.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. An apparatus, comprising:
   a plurality of memory cells to couple to a word line responsive to an external read command; and
   a delay circuit including a counter, the delay circuit operable to activate the wordline with a delay period determined according to a read level voltage magnitude associated with the plurality of memory cells, and operable to determine a delay period count.

2. The apparatus of claim 1, wherein the plurality of memory cells comprise a flash memory array.

3. The apparatus of claim 1, wherein the counter is operable to count out the delay period according to a predetermined counter value.

4. The apparatus of claim 3, wherein the predetermined counter value comprises one of up to three indicated values that depend upon a read voltage.

5. An apparatus, comprising:
a plurality of memory cells to couple to a word line responsive to an external read command; and
a delay circuit including a table, the delay circuit operable to activate the wordline with a delay period determined according to a read level voltage magnitude associated with the plurality of memory cells, and operable to determine a delay period count based upon values stored in the table.

6. The apparatus of claim 5, wherein the plurality of memory cells comprise a flash memory array.

7. The apparatus of claim 5, wherein the table includes entries referenced according to a magnitude of the read level voltage.

8. A method of sensing in a memory device, comprising:
driving a control gate of an unselected memory cell to a first voltage level; and
driving the control gate of a selected memory cell to a second voltage level after a delay period, wherein driving the control gate of a selected memory cell to a second voltage level after a delay period comprises selecting the delay period based upon counting up to one of three values after a read operation begins.

9. The method of claim 8, comprising:
holding the control gate of the selected memory cell at a selected initial level prior to driving the control gate to the second voltage level.

10. The method of claim 9, wherein holding the control gate of the selected memory cell at a selected initial level comprises holding the control gate at a reference level.

11. The method of claim 10, wherein holding the control gate of the selected memory cell at a selected initial level comprises holding the control gate at zero volts.

12. The method of claim 8, wherein driving the control gate of a selected memory cell to a second voltage level after a delay period comprises selecting the delay period based upon a magnitude of the second voltage level.

13. A method of sensing in a memory device, comprising:
driving a control gate of an unselected memory cell to a first voltage level; and
driving the control gate of a selected memory cell to a second voltage level after a delay period, wherein driving the control gate of a selected memory cell to a second voltage level after a delay period comprises selecting the delay period based upon a table having entries referenced to the second voltage level.

\* \* \* \* \*